United States Patent
Vice

(10) Patent No.: US 7,646,231 B2
(45) Date of Patent: Jan. 12, 2010

(54) SYSTEM AND METHOD FOR CONTROLLING ATTENUATOR

(75) Inventor: Michael Wendell Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/029,034

(22) Filed: Feb. 11, 2008

(65) Prior Publication Data

US 2009/0201091 A1 Aug. 13, 2009

(51) Int. Cl.
*H03L 5/00* (2006.01)
(52) U.S. Cl. .................... 327/308; 333/81 R
(58) Field of Classification Search .......... 327/306, 327/308; 333/81 R
See application file for complete search history.

(56) References Cited

U.S. PATENT DOCUMENTS

| 3,796,945 A | * | 3/1974 | Feldman et al. ............ 381/101 |
| 5,448,207 A | * | 9/1995 | Kohama ..................... 333/81 R |
| 7,221,207 B2 | * | 5/2007 | Fukumoto et al. ........... 327/365 |
| 7,250,804 B2 | * | 7/2007 | Brindle ....................... 327/365 |

* cited by examiner

*Primary Examiner*—Dinh T. Le

(57) ABSTRACT

An apparatus for setting an attenuation of an attenuator includes a control transistor, which includes a drain connected to a gate of a shunt transistor of the attenuator. A channel resistance of the shunt transistor corresponds to a current density of the control transistor, and the channel resistance of the shunt transistor determines the attenuation of the attenuator. The current density of the control transistor is based at least in part on a control voltage input to the apparatus.

17 Claims, 5 Drawing Sheets

SYSTEM AND METHOD FOR CONTROLLING ATTENUATOR

BACKGROUND

Current transistor attenuator technology utilizes series and shunt connected field effect transistors (FETs) to achieve desired attenuation, while maintaining good port matching. For example, FIG. 1 is a block diagram of a known attenuator 100, which includes FET 122 and FET 124 connected in series and a shunt transistor FET 132. A drain of FET 122 is connected to an input port 110 for inputting an input signal and a drain of FET 124 is connected to an output port 112 for outputting an attenuated output signal. Sources of the series transistors FETs 122, 124 are connected to one another, forming node 126. A source of the shunt transistor FET 132 is connected to ground and a drain of the shunt transistor FET 132 is connected to node 126. Each of the transistors FET 122, 124, 132 may be gallium arsenide field-effect transistors (GaAsFETs), for example.

Typically, the attenuation of a conventional attenuator, such attenuator 100, is set by control voltages that directly or indirectly control the gate voltages of the transistors FET 122, 124, 132. For example, the shunt transistor FET 132 is controlled by a shunt gate voltage (Vg_shunt) through port 130, to which the gate of FET 132 is connected. Vg_shunt may be an external control voltage. The series transistors FETs 122, 124 are controlled by a series gate voltage (Vg_series) source 120, to which the gates of FETs 122, 124 are respectively connected. Vg_series may be a voltage produced within the attenuator 100, as a function of the external control voltage received through port 130.

Channel resistance of a transistor typically changes abruptly with gate voltage. Therefore, when the control voltage of attenuator 100 is directly coupled to the gate of FET 132, the attenuation of attenuator 100 will change abruptly with control voltage, making it difficult to precisely set attenuator 100 to a desired attenuation. Further, other variables, such as changes in process and/or temperature, shift the attenuation curve, so that the control voltage required for a particular attenuation is subject to change, drift and other uncertainty.

For example, FIG. 5 is a graph illustrating performance of a conventional attenuator, such as attenuator 100. The vertical axis shows the transmission S-parameter or forward transmission coefficient $S_{2,1}$ in decibels and the horizontal axis shows control voltage Vc (e.g., Vg_shunt) in volts. Accordingly, the curve of FIG. 5 indicates changes in attenuation as the control voltage Vc increases. It is apparent that the attenuation increases (i.e., the forward transmission coefficient $S_{2,1}$ decreases) abruptly in response to relatively minor increases to the control voltage Vc. For example, the attenuation increases over 15 dB as the control voltage changes from 0.2V to 0.4 V. Such abrupt response characteristics make it very difficult to accurately set desired attenuation by changing the control voltage Vc.

Efforts to improve attenuation control have included use of an operational amplifier in conjunction with a replica attenuator. For example, FIG. 2 is a block diagram of a known attenuator 200, which includes main attenuator 201, replica attenuator 202 and operational amplifier 254. The main attenuator 201, which is similar to attenuator 100 discussed above, includes series FETs 222, 224 connected at node 226 and shunt FET 232. The replica attenuator 202 likewise includes series FETs 242, 244 connected at node 246 and shunt FET 252.

The operational amplifier 254 receives as input the control voltage Vcontrol through port 250 and a feedback voltage output from the drain of series FET 244. An output of the operational amplifier 254 is the gate voltage for the shunt FET 232 of the main attenuator 201 and the shunt FET 252 of the replica attenuator 202. The gate voltages of the series FETs 222, 224 of the main attenuator 201 and FETs 242, 244 of the replica attenuator 202 are provided by Vg_series. Vg_series is a voltage which may be produced from within the attenuator control circuitry as a response to the value of Vcontrol, or it may be produced externally.

In the main attenuator 201, a drain of FET 222 is connected to an input port 210 for inputting an input signal and a drain of FET 224 is connected to an output port 212 for outputting an attenuated output signal. Sources of the series transistors FETs 222, 224 are connected to one another, forming node 226. In the replica attenuator 202, a drain of FET 242 is connected through a resistor R1 to a reference voltage source 225 and a drain of FET 244 is connected through a resistor R4 to ground. Sources of the series transistors FETs 242, 244 are connected to one another, forming node 246.

The replica attenuator 202 is a scaled direct current version of the main attenuator 201, and is used within the feedback loop of the operational amplifier 254 to force the desired attenuation in response to the control voltage. However, the inclusion of the replica attenuator 202, the operational amplifier 254 and other additional electrical components, increases both complexity and size of attenuator 200, which is inconsistent with typical commercial trends and goals involving lower cost and smaller size.

SUMMARY

In a representative embodiment, an apparatus for setting an attenuation of an attenuator includes a control transistor having a drain connected to a gate of a shunt transistor of the attenuator. A channel resistance of the shunt transistor, which corresponds to a current density of the control transistor, determines the attenuation of the attenuator.

In another representative embodiment, a bias controller controls attenuation of an attenuator having at least one shunt transistor. The bias controller includes a transistor having a gate and a drain connected to a bias control node and a resistor connected in series between a voltage supply and the bias control node. The resistor is operative to receive a control voltage from the voltage supply and to supply a current to the drain of the transistor to attain a gate voltage. A gate of the at least one shunt transistor of the attenuator is connected to the bias control node for receiving the gate voltage from the bias controller to control the attenuation of the attenuator.

In another representative embodiment, an apparatus for setting an attenuation of an attenuator includes a control field effect transistor (FET), a port and a resistor. The control FET includes a drain and a gate connected to a gate of a shunt FET of the attenuator. A channel resistance of the shunt FET corresponds to a current density of the control FET. The port receives a control voltage, and the resistor is connected in series between the port and the drain of the control FET. The resistor is operative to inject a current into the drain of the control FET in response to the control voltage, the current density of the control FET being based on the injected current. The channel resistance of the shunt FET determines the attenuation of the attenuator in response to a gate voltage of the control FET.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Figure 1:
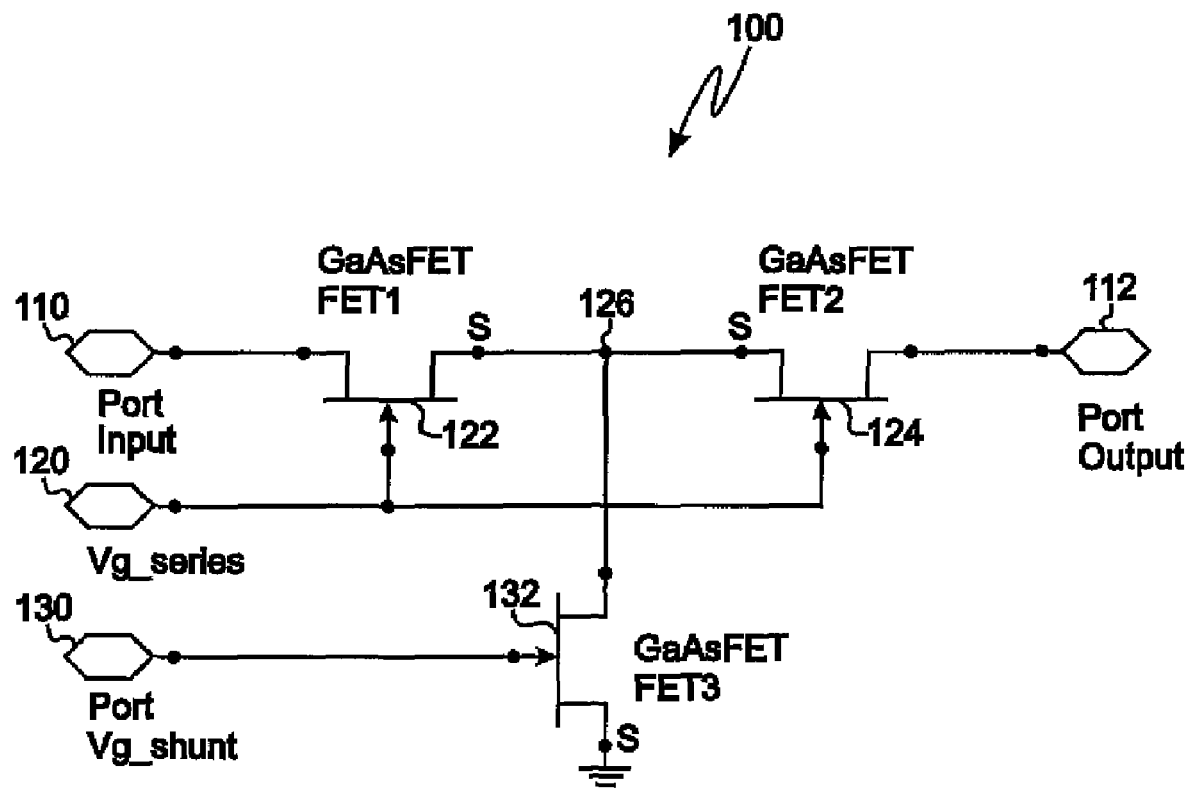
FIG. 1 is a block diagram illustrating a conventional attenuator.
Figure 2:
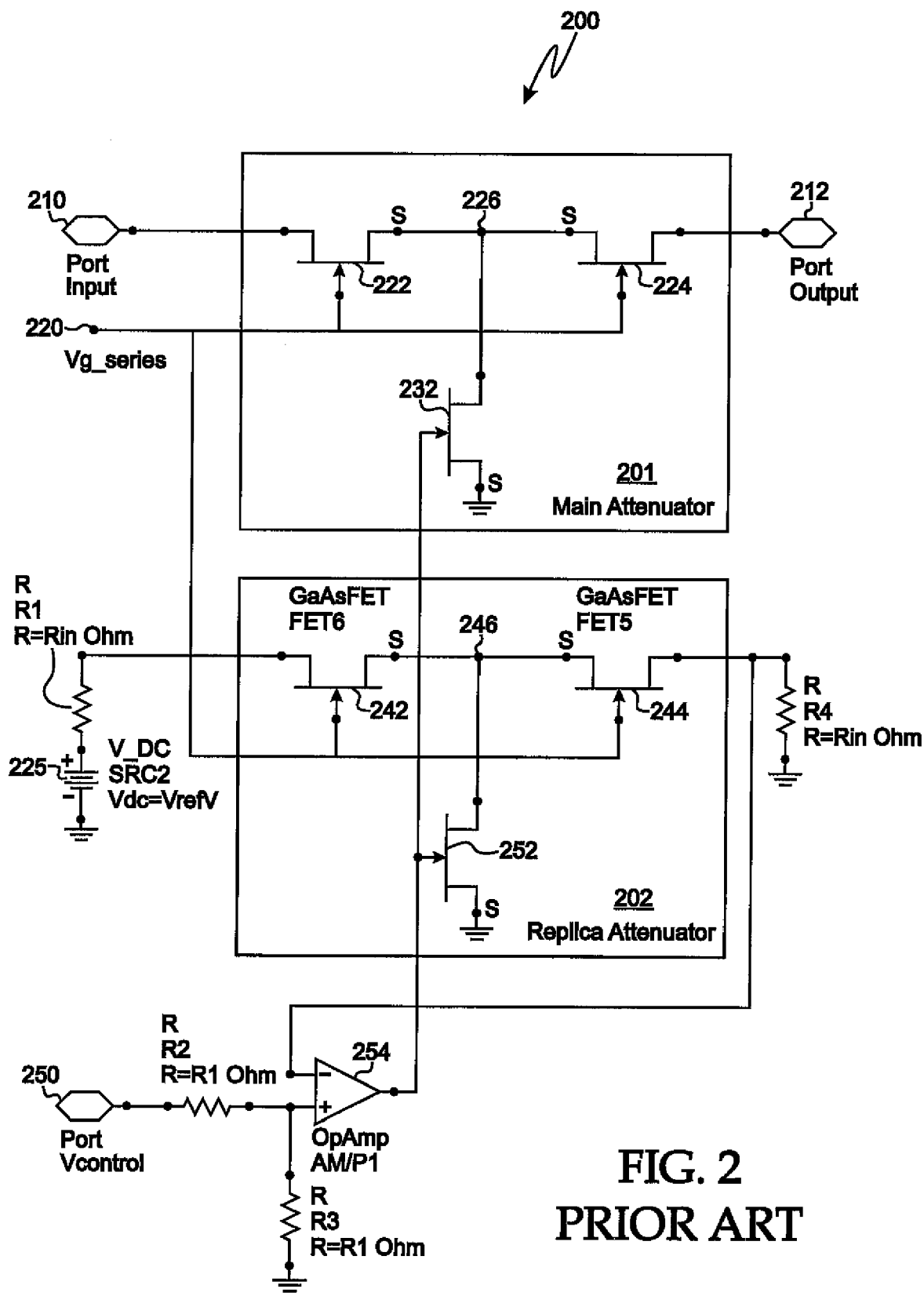
FIG. 2 is a block diagram illustrating a conventional attenuator.
Figure 3:
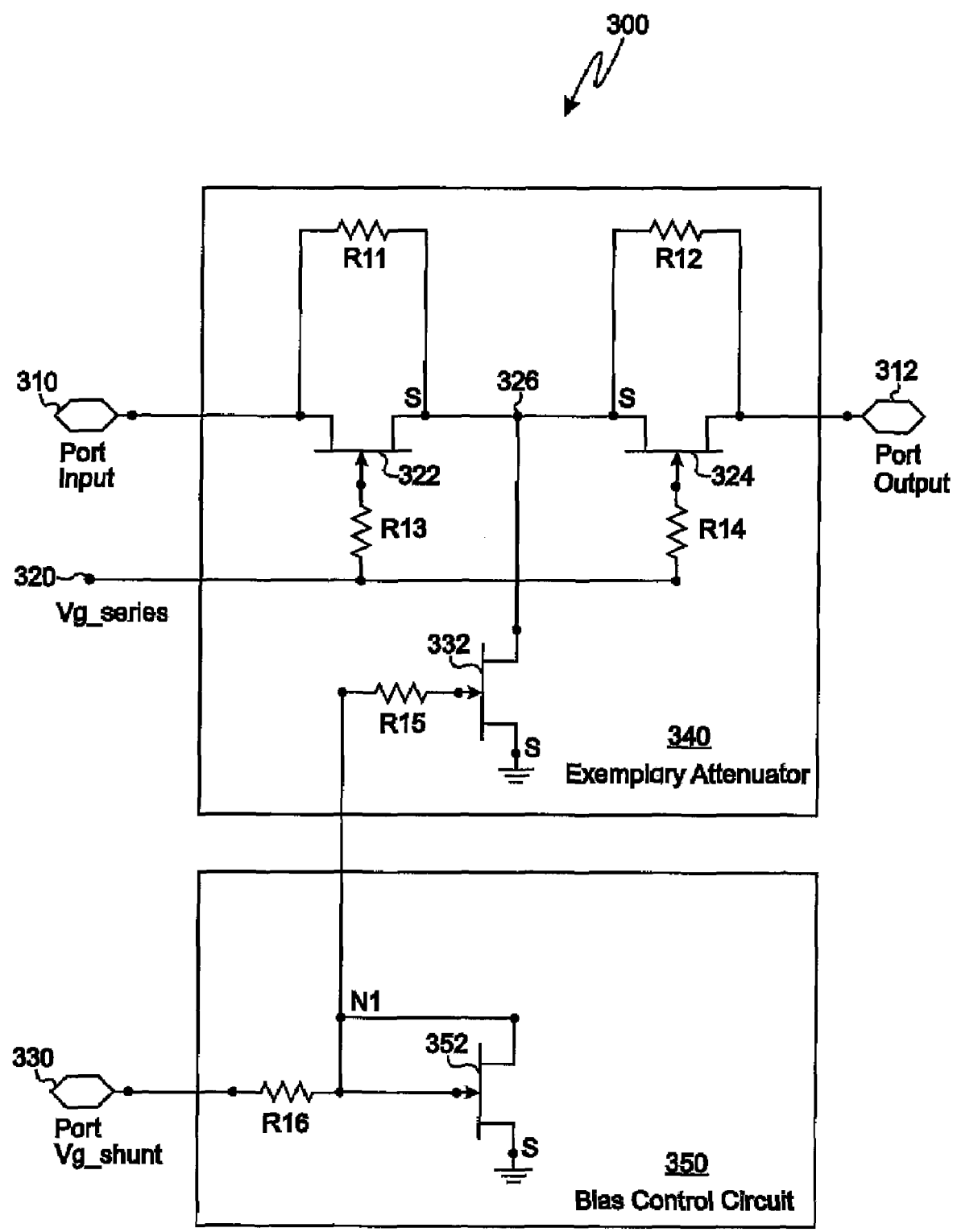
FIG. 3 is a block diagram illustrating an attenuator controller, according to a representative embodiment.

FIG. 3 is a block diagram illustrating an attenuator controller, according to an illustrative embodiment. In particular, FIG. 3 shows an exemplary attenuator 340 connected to bias control circuit 350. The circuitry of the attenuator 340 includes at least one shunt transistor, such as shunt FET 332 transistor. The remaining circuitry of the attenuator 340 is shown in FIG. 3 for purposes of facilitating explanation, and may vary significantly and still function as described herein in conjunction with the bias control circuit 350. Thus, it is understood that the bias control circuit 350 is not limited to working with the exemplary attenuator 340, but is able to function with any attenuator having a shunt transistor, as discussed below.

A gate of FET 332 of the exemplary attenuator 340 is connected to resistor R15, which receives a gate voltage from the bias control circuit 350. A source of FET 332 is connected to a ground voltage and a drain of FET 332 is connected to node 326, formed by the connected sources of series transistors FET 322 and FET 324.

Gates of FETs 322, 324 are connected to voltage source 320, indicated as Vg_series, through resistors R13 and R14, respectively. Vg_series may be a function of the external control voltage (e.g., Vg_shunt), produced within the attenuator 340, for example. Thus, the voltage supplied to the gates of series FETs 322, 324 may be functionally related to Vg_shunt, and maintains desired port impedance over the attenuation range. In other words, the voltage supplied to the gates of the series FETs 322, 324 is intended to produce optimum port impedance (e.g., 50 ohms) at each attenuation value, and may vary independently of the various embodiments.

A drain of FET 322 is connected to input port 310 to receive an input signal and voltage, and a drain of FET 324 is connected to output port 312 to output an attenuated signal based on the input signal. Also, as discussed above, FETs 322, 324 (as well as FET 332 and other transistors discussed herein) may be GaAsFETs, for example, Both FET 412 and FET 413 may be GaAs FET transistors, for example, although other types of FETs (and/or other types of transistors) within the purview of one of ordinary skill in the art may be incorporated into the attenuator 300, without departing from the spirit and scope of the present teachings. For example, transistors may include high electron mobility transistors (HEMTs), pseudomorphic HEMTs, heterostructure FETs (HFETs), etc.

FETs 322, 324 have channel resistors R11 and R12 connected between their respective sources and drains. Each of the resistors R11, R12 may be 50 ohms, for example. The general purpose of resistors R11, R12 is to maintain a good port match throughout the attenuation range. For example, when FETs 322, 324 are opened up (off) to achieve high attenuation, the resistors R11, R12 continue to provide the appropriate port match (e.g., 50 ohms). In addition, resistors R13 and R14 are connected in series between the voltage source 320 and the respective gates of FETs 322 and 324. Resistors R13, R14 are typically large in comparison to system impedance. For example each of the resistors R13, R14 may have a value of 5,000 ohms in a 50 ohm system.

The bias control circuit 350 of FIG. 3 includes transistor FET 352, resistor R16 and port 330, which receives a control voltage, indicated as shunt voltage Vg_shunt. The resister R16 is connected in series between a gate of FET 352 and port 330. A source of FET 352 is connected to a ground voltage and a drain of FET 352 is connected to node N1, located between the resistor R16 and the gate of FET 352. It is understood that the sources/drains of the various transistors may be reversed, without affecting the relevant functionality of the exemplary attenuator 340 and/or the bias control circuit 350, depending on design factors of various embodiments.

The resistor R16 may have a relatively large resistance and thus acts as a current source when biased by the control voltage (e.g., Vg_shunt) to inject current into the drain of FET 352. The values of FET 352, FET 332, resistor R16 and Vg_shunt are selected to produce desired scaling of the attenuator 340, as would be appreciated by one of ordinary skill in the art. The particular values may be adjusted to provide unique benefits for any particular situation or to meet various application specific design requirements.

The bias control circuit 350 works in conjunction with the at least one shunt transistor (e.g., FET 332) of the attenuator 340 to implement a control relationship similar in concept to a current mirror operation. However, because FET 332 of the attenuator 340 is not normally channel biased so as to draw DC current, the current flowing within FET 352 is functionally related to the channel resistance of FET 332. More particularly, FET 332 attains a triode region channel resistance that corresponds to a current density of FET 352 of the bias control circuit 350. The current density of FET 352 is a function of the current injected into the drain of FET 352 from the resistor R16 and the size (e.g., the total gate width) of FET 352. Accordingly, the channel resistance of FET 332 is essentially set by the current injected into FET 352 from the resistor R16, based on the input control voltage Vg_shunt. The channel resistance of FET 332 determines the corresponding attenuation of the attenuator 340.

Therefore, because the channel resistance of FET 332 varies in accordance with the current injected into FET 352, and the current is determined by the control voltage Vg_shunt, it follows that the attenuation of the attenuator 340 is effectively controlled by the control voltage Vg_shunt. The size of FET 352 and the value of the resistor R16 are selected to control the gain (dB/V) of the attenuator 340. For example, when FET 352 is 25 μm and the resistor R16 has a resistance value of 10 k ohms, the gain of the attenuator 340 is about 5 dB/V. It is understood, however, that the particular size and value of FET 352 and the resistor RI 6 may be adjusted to provide unique benefits for any particular situation or to meet various design requirements, without departing from the spirit and scope of the disclosure.

Although the bias control circuit 350 and FET 332 do not form an actual current mirror, the relationship provides advantages of a current mirror operation. For example, current mirrors suppress variances due to changes in process and temperature, and substantially depend on the current injected into them. Similarly, the relationship between the triode region channel resistance of FET 332 and a saturated region current density of FET 352 is robust, which likewise suppresses variances, e.g., due to process and temperature changes.

In other words, the amount of current injected into FET 352, which is set by the control voltage Vg_shunt (and the resistor R16), produces a known channel resistance in FET 332 (in response to the gate voltage). Therefore, there is a predictable result in the channel resistance even when the behaviors of FETs 332 and 352 are perturbed, e.g., by changes in process, temperature, etc. That is, the relationship between the current density of FET 352 and the channel resistance of FET 332 remains the same. The exact relationship may be determined based on particular attributes of the fabrication process and the relative sizes of FETs 332 and 352, the particular values of which may be adjusted to provide unique benefits for any particular situation or to meet various application specific design requirements, as would be appreciated by one of ordinary skill in the art.

Figure 4:
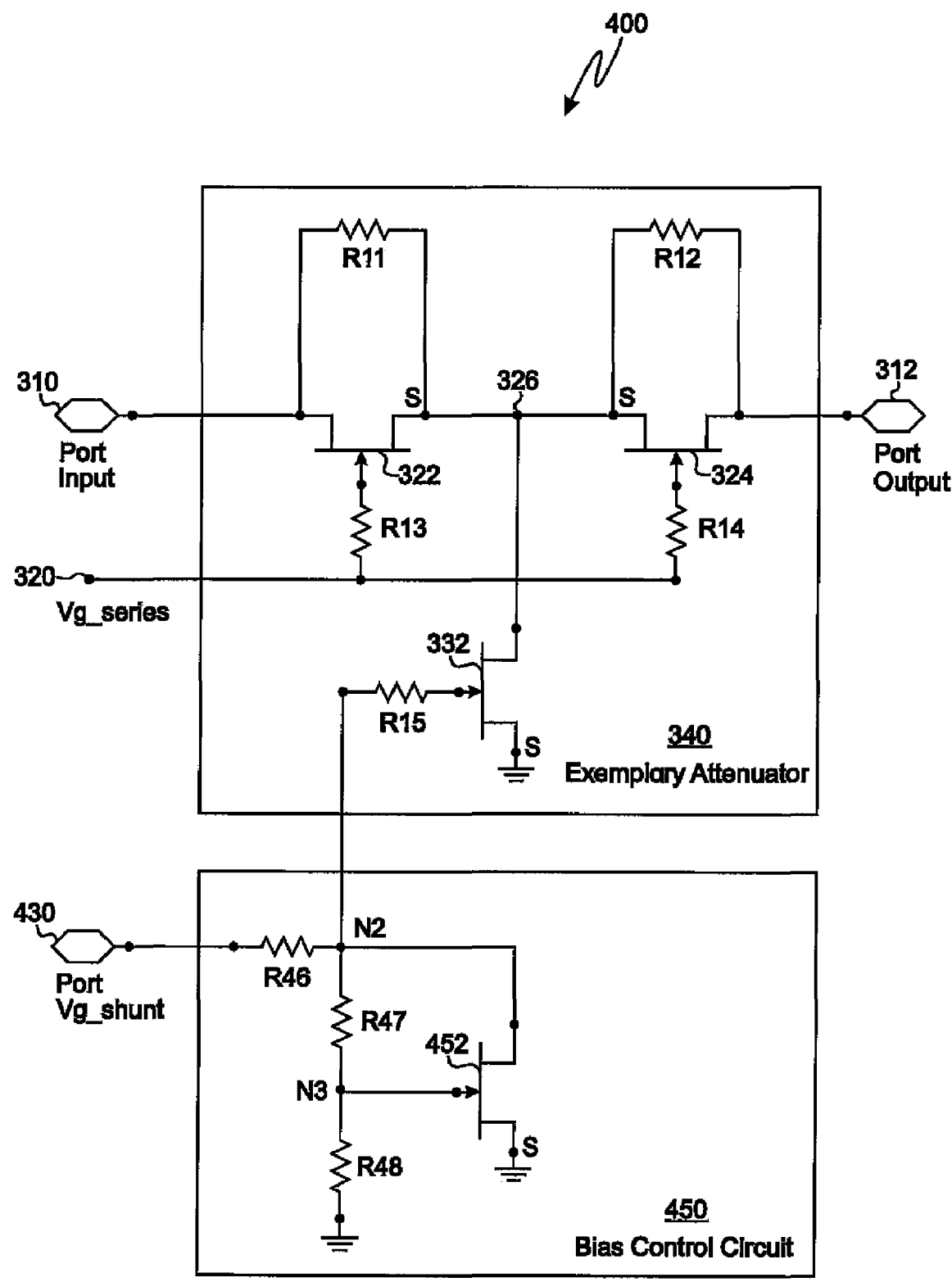
FIG. 4 is a block diagram illustrating an attenuator controller according to a representative embodiment.

FIG. 4 is a block diagram illustrating an attenuator controller, according to another illustrative embodiment. FIG. 4 shows an attenuator 340 connected to bias control circuit 450. For purposes of simplifying discussion, the circuitry of the exemplary attenuator 340 in FIG. 4 is the same as the attenuator 340 in FIG. 3, above. Therefore, description of the various components will not be repeated. It is understood, however, that the bias control circuit 450 is not limited to working with the exemplary attenuator 340, but is able to function with any attenuator having a shunt transistor.

The bias control circuit 450 of FIG. 4 includes transistor FET 452, resistor R46 and port 430, which provides a control voltage, indicated as shunt voltage Vg_shunt. FET 452 includes a source connected to ground and a drain connected to the node N2. The resistor R46 is connected between the port 430 and node N2, and is configured to inject current into the drain of FET 452. Two additional resistors, R47 and R48, are connected in series between node N2 and the ground voltage. A gate of FET 452 is connected to a node N3 located between the resistors R47 and R48. It is understood that the sources/drains of the various transistors may be reversed, without affecting the relevant functionality of the exemplary attenuator 340 and/or the bias control circuit 450, depending on design factors of various embodiments.

As configured, the bias control circuit 450 works in conjunction with the at least one shunt transistor of the attenuator 340 (e.g., FET 332) to implement a control relationship similar in concept to a current mirror operation. The additional resistors R47, R48 enable further customization of the attenuation curve of the attenuator 340. For example, the relative sizes of the resistors R47 and R48 may be adjusted to make the relationship between input control voltage and attenuation more or less linear.

In an illustrative embodiment, the resistors R47, R48 have large values, e.g., about 10 kohm, which will not draw substantial current from the control voltage supply, e.g., via port 430. The ratio of the resistor R47 to the resistor R48 alters the attenuation curve. For example, as the value of the resistor R48 is made smaller than that of the resistor R47, the attenuation curve becomes more compact and abrupt, the entire range of which is realized for a smaller range of control voltage. For example, in illustrative embodiments, when the resistor R47 is 10 kohm and the resistor R48 is 5 kohm, the attenuation sweeps its entire range between control voltages of 0V and 2V. When the resistor R48 is changed to 15 kohm (and R47 remains at 10 kohm), for example, the attenuation curve spreads out so that a control voltage range of 0V to 6V is needed to sweep over the entire attenuation range.

Figure 6:
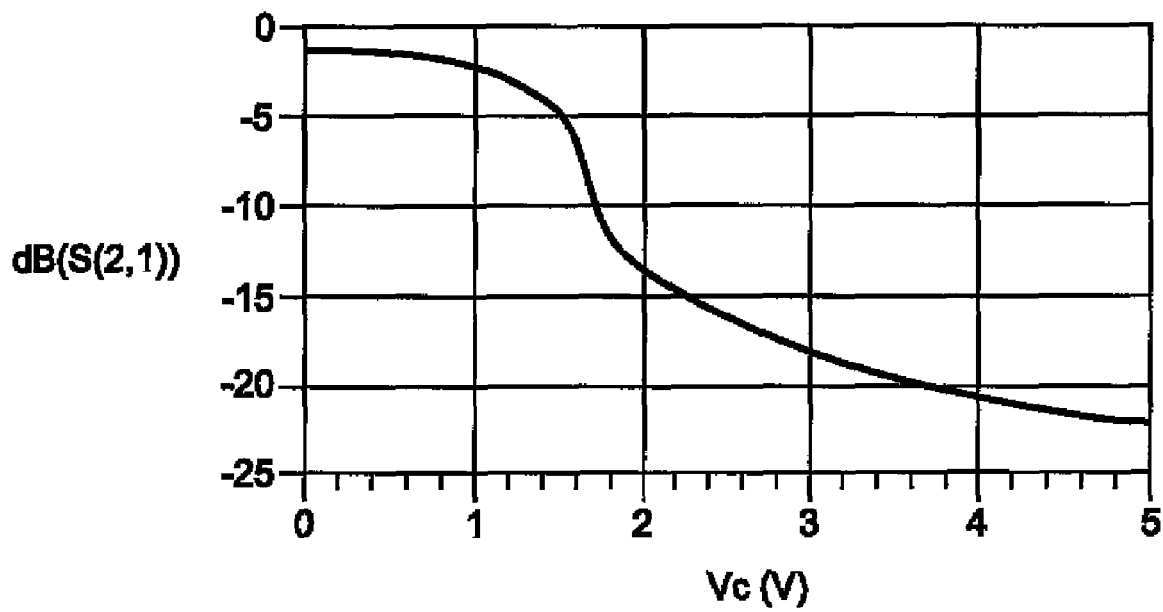
FIG. 6 is a graph illustrating performance of an attenuator using an attenuator controller, according to a representative embodiment.

FIG. 6 is a graph illustrating performance of an attenuator, such as attenuator 340, when controlled through a bias control circuit, such as bias control circuit 350 or 450, according to various embodiments. The vertical axis shows the transmission S-parameter or forward transmission coefficient $S_{2,1}$ in decibels and the horizontal axis shows control voltage Vc (e.g., Vg_shunt) in volts. Accordingly, the curve of FIG. 6 indicates changes in attenuation as the control voltage Vc increases.

Figure 5:
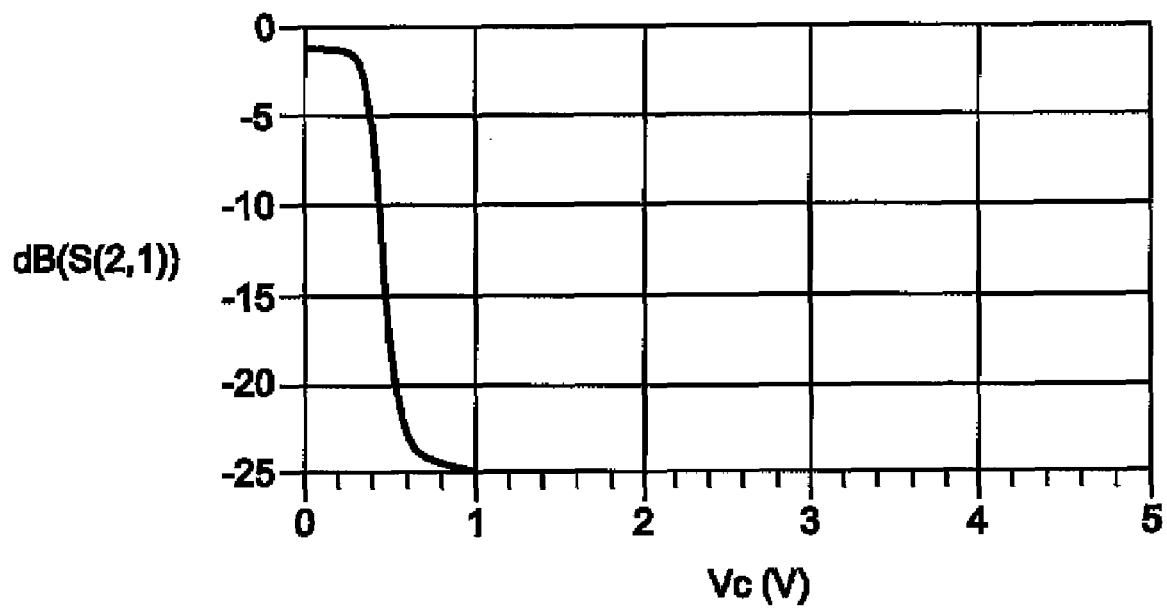
FIG. 5 is a graph illustrating performance of a conventional attenuator.

It is apparent that the attenuation increases relatively gradually in response to increases in the control voltage Vc, e.g., as compared to the graph of FIG. 5 illustrating a conventionally controlled attenuator. For example, using the same data points discussed above with respect to FIG. 5, the attenuation depicted by the graph of FIG. 6 increases less than 1 dB as the control voltage changes from 0.2V to 0.4V (as compared to over 15 dB in FIG. 5). In fact, the attenuation increases approximately the same between 0V and 3V in FIG. 6 as between 0.2V and 0.4V in FIG. 5. Such gradual response characteristics make it easier to accurately set desired attenuation by changing the control voltage Vc.

Accordingly, the depicted illustrative embodiments overcome the abrupt and inconsistent control characteristics inherent to conventional untreated attenuators, without substantially increasing size and/or complexity of the attenuation circuit. Further, the depicted embodiments are process and temperature insensitive, for example.

In view of this disclosure it is noted that variant attenuators and attenuator controllers can be implemented in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An apparatus for setting an attenuation of an attenuator configured to receive an input signal and to output an attenuated output signal based on the attenuation, the apparatus comprising:

a control transistor comprising a drain connected to a gate of a shunt transistor of the attenuator and a control voltage source; and a first resistor, connected between the control voltage source and the drain of the control transistor, for supplying a current in response to a control voltage from the control voltage source, the current establishing a current density of the control transistor and a corresponding channel resistance of the shunt transistor, wherein the channel resistance of the shunt transistor determines the attenuation of the attenuator.

2. The apparatus of claim 1, wherein the first resistor supplies the current to the drain of the control transistor in response to the control voltage, wherein the current density of the control transistor is based at least in part on the supplied current.

3. The apparatus of claim 2, wherein the first resistor supplies the current to the drain of the control transistor when biased by the control voltage.

4. The apparatus of claim 3, wherein the channel resistance of the shunt transistor changes in response to changes in the control voltage, thereby changing the attenuation of the attenuator.

5. The apparatus of claim 1, wherein the first resistor is connected to the drain of the control transistor at a first node.

6. The apparatus of claim 5, further comprising:

a second resistor connected between the first node and the gate of the control transistor; and a third resistor connected between the gate of the control transistor and ground, wherein values of the second and third resistors determine a range of the control voltage over which the attenuation of the attenuator occurs.

7. The apparatus of claim 6, wherein when the value of the third resistor is less than the value of the second resistor, the range of the control voltage over which the attenuation range occurs is less than when the value of the third resistor is greater than the value of the second resistor.

8. The apparatus of claim 1, wherein each of the control transistor and the shunt transistor of the attenuator comprises a field effect transistor.

9. A bias controller for controlling attenuation of an attenuator comprising at least one shunt transistor, the attenuator receiving an input signal and outputting an attenuated output signal corresponding to the input signal, the bias controller comprising:

a transistor comprising a gate and a drain connected to a bias control node; and a resistor connected in series between a voltage supply and the bias control node, the resistor receiving a control voltage from the voltage supply and supplying a current to the drain of the transistor to attain a gate voltage, wherein a gate of the at least one shunt transistor of the attenuator is connected to the bias control node for receiving the gate voltage from the bias controller to control the attenuation of the attenuator.

10. The bias controller of claim 9, wherein the attenuation is determined by a channel resistance of the at least one shunt transistor, the channel resistance being set in response to the received gate voltage.

11. The bias controller of claim 10, wherein the resistor acts as a source of the supplied current when biased by the control voltage.

12. The bias controller of claim 11, wherein changes in the control voltage cause corresponding changes in the attenuation of the attenuator by changing the current supplied to the drain of the transistor.

13. The bias controller of claim 11, wherein a current density of the transistor is determined at least in part by the supplied current.

14. The bias controller of claim 9, wherein the transistor comprises a gallium arsenide field effect transistor.

15. An apparatus for setting an attenuation of an attenuator, the apparatus comprising:

a control field effect transistor (FET) comprising a drain and a gate connected to a gate of a shunt FET of the attenuator;

a port configured to receive a control voltage; and a resistor connected in series between the port and the drain of the control FET, the resistor being configured to inject a current into the drain of the control FET in response to the control voltage, a current density of the control FET and a channel resistance of the shunt FET being set in response to the injected current, wherein the channel resistance of the shunt FET determines the attenuation of the attenuator for attenuating a signal input to the attenuator.

16. The apparatus of claim 15, wherein the gate voltage of the control FET is determined, at least in part, by the current density of the control FET.

17. The apparatus of claim 16, wherein the attenuation of the attenuator changes in response to changes in the control voltage.

* * * * *